United States Patent
Zhou et al.

(10) Patent No.: US 11,171,684 B1
(45) Date of Patent: Nov. 9, 2021

(54) CONTROL OF TRANMSITTING AND RECEVING ANTENNA PROPERTIES TO REDUCE ELECTROMAGNETIC COUPLING

(71) Applicants: Quming Zhou, Houston, TX (US); Stanislav Forgang, Houston, TX (US); Marc Stephen Ramirez, Missouri City, TX (US)

(72) Inventors: Quming Zhou, Houston, TX (US); Stanislav Forgang, Houston, TX (US); Marc Stephen Ramirez, Missouri City, TX (US)

(73) Assignee: BAKER HUGHES OILFIELD OPERATIONS LLC, Houston, TX (US)

( * ) Notice: Subject to any disclaimer, the term of this patent is extended or adjusted under 35 U.S.C. 154(b) by 0 days.

(21) Appl. No.: 16/894,161

(22) Filed: Jun. 5, 2020

(51) Int. Cl.
*H04B 5/00* (2006.01)
*H04B 1/525* (2015.01)
(Continued)

(52) U.S. Cl.
CPC .......... *H04B 1/525* (2013.01); *G01N 24/081* (2013.01); *G01N 24/082* (2013.01); *G01V 3/32* (2013.01); *H04B 1/1009* (2013.01)

(58) Field of Classification Search
CPC ...... H04B 5/0043; H04B 5/0081; H04B 5/02; H04B 7/00; G01V 3/32; G01N 24/081; G01N 24/082
See application file for complete search history.

(56) References Cited

U.S. PATENT DOCUMENTS 5,477,146 A 12/1995 Jones
5,892,482 A 4/1999 Coleman, Jr. et al.
(Continued)

FOREIGN PATENT DOCUMENTS

WO 2017058482 A1 4/2017
WO 2018065338 A1 4/2018

OTHER PUBLICATIONS

Hui, Hon Tat; An Effective Compensation Method for the Mutual Coupling Effect in Phased Arrays for Magnetic Resonance Imaging; IEEE Transactions On Antennas and Propagation, vol. 53, No. 11, Nov. 2005.
(Continued)

*Primary Examiner* — Tuan Pham
(74) *Attorney, Agent, or Firm* — Cantor Colburn LLP

(57) ABSTRACT

An NMR measurement apparatus includes a transmitting antenna including a transmitter coil, a capacitor, a dissipating component and a restricting component, and a receiving antenna physically separated from the transmitting antenna. A processor is configured to apply a drive signal at a first voltage level to generate a transmission signal having a selected transmission frequency, where the receiving antenna is deactivated during generation, connect the dissipating component to the transmitter coil to dissipate stored energy in the transmitter coil, connect the restricting component to the transmitter coil to restrict the transmitting antenna to a second voltage level smaller than the first voltage level and based on a voltage of NMR signals from the sensitive volume, activate the receiving antenna and detect a NMR signal, where the restricting component is connected to the transmitter coil and restricts the transmitting antenna during the activating and the detecting.

20 Claims, 5 Drawing Sheets

(51) Int. Cl.
  *G01N 24/08*  (2006.01)
  *G01V 3/32*   (2006.01)
  *H04B 1/10*   (2006.01)

(56) References Cited

U.S. PATENT DOCUMENTS

| | | | |
|---|---|---|---|
| 5,903,150 | A | 5/1999 | Rotznitsky |
| 6,445,180 | B1 | 9/2002 | Reiderman et al. |
| 6,603,309 | B2 | 8/2003 | Forgang et al. |
| 7,916,920 | B2 | 3/2011 | Seifert et al. |
| 8,049,504 | B2 | 11/2011 | Findeklee |
| 9,214,724 | B2 | 12/2015 | White et al. |
| 9,348,054 | B2 * | 5/2016 | Walsh ................ G01V 3/14 |
| 9,816,375 | B2 | 11/2017 | Chimakirthy |
| 10,145,976 | B2 * | 12/2018 | Ramirez ............ G01R 33/383 |
| 2008/0136710 | A1 | 6/2008 | Nefedov et al. |
| 2015/0115959 | A1 * | 4/2015 | Grodzki ............. G01R 33/28 |
| | | | 324/309 |
| 2018/0172785 | A1 | 6/2018 | Leussler et al. |
| 2018/0263561 | A1 | 9/2018 | Jones |

OTHER PUBLICATIONS

Hui, Hon Tat; Decoupling Methods for the Mutual Coupling Effect in Antenna Arrays: A Review; Recent Patents on Engineering 2007, 1, 187-193.

* cited by examiner

CONTROL OF TRANMSITTING AND RECEVING ANTENNA PROPERTIES TO REDUCE ELECTROMAGNETIC COUPLING

BACKGROUND

Understanding the characteristics of geologic formations and fluids located therein is important for effective hydrocarbon exploration and production. Formation evaluation relies on accurate petrophysical interpretation derived from a diverse set of logging technologies. One such technology, nuclear magnetic resonance (NMR), can be used to estimate formation characteristics such as mineralogy-independent porosity and permeability of rocks, to perform fluid typing and determine fluid volumes, and to estimate fluid characteristics such as viscosity. NMR tools may include separate receiving and transmitting antennas, or transceiver antennas capable of both transmission of measurement signal and detection of NMR signals from a sensitive volume.

SUMMARY

An embodiment of a nuclear magnetic resonance (NMR) measurement apparatus includes a magnet configured to generate a static magnetic field in a sensitive volume, a transmitting antenna including a transmitter coil, a capacitor, a dissipating component and a restricting component, the capacitor configured to tune the transmitting antenna to a selected transmission frequency, a receiving antenna physically separated from the transmitting antenna, and a processor electrically connected to the transmitting antenna and the receiving antenna. The processor is configured to apply a drive signal at a first voltage level to the transmitter coil to generate a transmission signal in the sensitive volume having a frequency corresponding to the selected transmission frequency, where the receiving antenna is deactivated during generation of the transmission signal, connect the dissipating component to the transmitter coil to dissipate stored energy in the transmitter coil, connect the restricting component to the transmitter coil to restrict the transmitting antenna to a second voltage level and increase an impedance of the transmitting antenna to the second voltage level, the second voltage level smaller that the first voltage level and based on a voltage of NMR signals from the sensitive volume, activate the receiving antenna and detect a NMR signal, where the restricting component is connected to the transmitter coil and restricts the transmitting antenna during the activating and the detecting.

An embodiment of a method of performing a nuclear magnetic resonance (NMR) measurement includes disposing a measurement tool proximate to a sensitive volume, the measurement tool including a magnet configured to generate a static magnetic field in the sensitive volume, a transmitting antenna, and a receiving antenna physically separated from the transmitting antenna, the transmitting antenna including a transmitter coil, a capacitor, a dissipating component and a restricting component, the capacitor configured to tune the transmitting antenna to a selected transmission frequency. The method also includes generating a static magnetic field by the magnet, applying a drive signal at a first voltage level to the transmitter coil to generate a transmission signal in the sensitive volume having a frequency corresponding to the selected transmission frequency, where the receiving antenna is deactivated during generation of the transmission signal, connecting the dissipating component to the transmitter coil to dissipate stored energy in the transmitter coil, and connecting the restricting component to the transmitter coil to restrict the transmitting antenna to a second voltage level and increase an impedance of the transmitting antenna to the second voltage level, the second voltage level smaller that the first voltage level and based on a voltage of NMR signals from the sensitive volume. The method further includes activating the receiving antenna and detecting a NMR signal, where the restricting component is connected to the transmitter coil and restricts the transmitting antenna during the activating and the detecting.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

DETAILED DESCRIPTION

Apparatuses and methods for performing nuclear magnetic resonance (NMR) measurements and/or measuring characteristics of a sensitive volume, such as a formation or other subterranean region, are described herein. An embodiment of a nuclear magnetic resonance (NMR) apparatus or tool includes a magnet assembly configured to generate static magnetic fields, and an antenna assembly including one or more transmitting antennas and one or more receiving antennas. In one embodiment, each transmitting antenna includes a transmission coil (or coils) that is physically separated from a receiver coil (or coils) of each receiving antenna The NMR apparatus includes or is connected to a controller configured to actively control properties of the receiving antenna and the transmitting antenna to reduce or minimize coupling therebetween. The properties may be controlled in order to control the impedance of the receiving antenna and the transmitting antenna. The controller can modify the resistive load, the capacitance and/or the coupling inductance of the transmitting antenna and/or the receiving antenna for this purpose.

In one embodiment, the receiving antenna and the transmitting antenna each include one or more switches to selectively connect and disconnect components thereof, in order to modify properties and actively control the impedance. For example, the transmitting antenna includes a transmitter coil including an inductor, and further includes a capacitor, a resistor and a clamp circuit. The capacitor, the resistor and the clamp circuit are selectively connectable via respective switches that may be controlled by the controller. The receiving antenna includes at least one switch for de-energizing the receiver antenna during a transmission phase of an NMR measurement process.

In one embodiment, the controller is configured to perform a switching sequence during performance of a NMR measurement. The switching sequence modifies properties of the antennas to reduce or minimize coupling effects, thereby improving performance of the NMR apparatus. Examples of reduced coupling effects include reduced Q-factor, increased noise, reduced sensitivity, reduced signal-to-noise ratio, occurrence of overvoltage spikes, etc.

It will be understood that, although a single coil is discussed for each antenna, the antennas may have any number of coils, and any number of windings making up a coil. It is also noted that embodiments described herein are not limited to the specific shape, size and configuration of the coils and various components of the antennas.

Furthermore, although embodiments are described below in conjunction with downhole or subterranean operations, the embodiments are not so limited. The NMR measurement apparatuses can be used in a variety of contexts, such as medical imaging, or any other application of NMR measurements.

Figure 1:
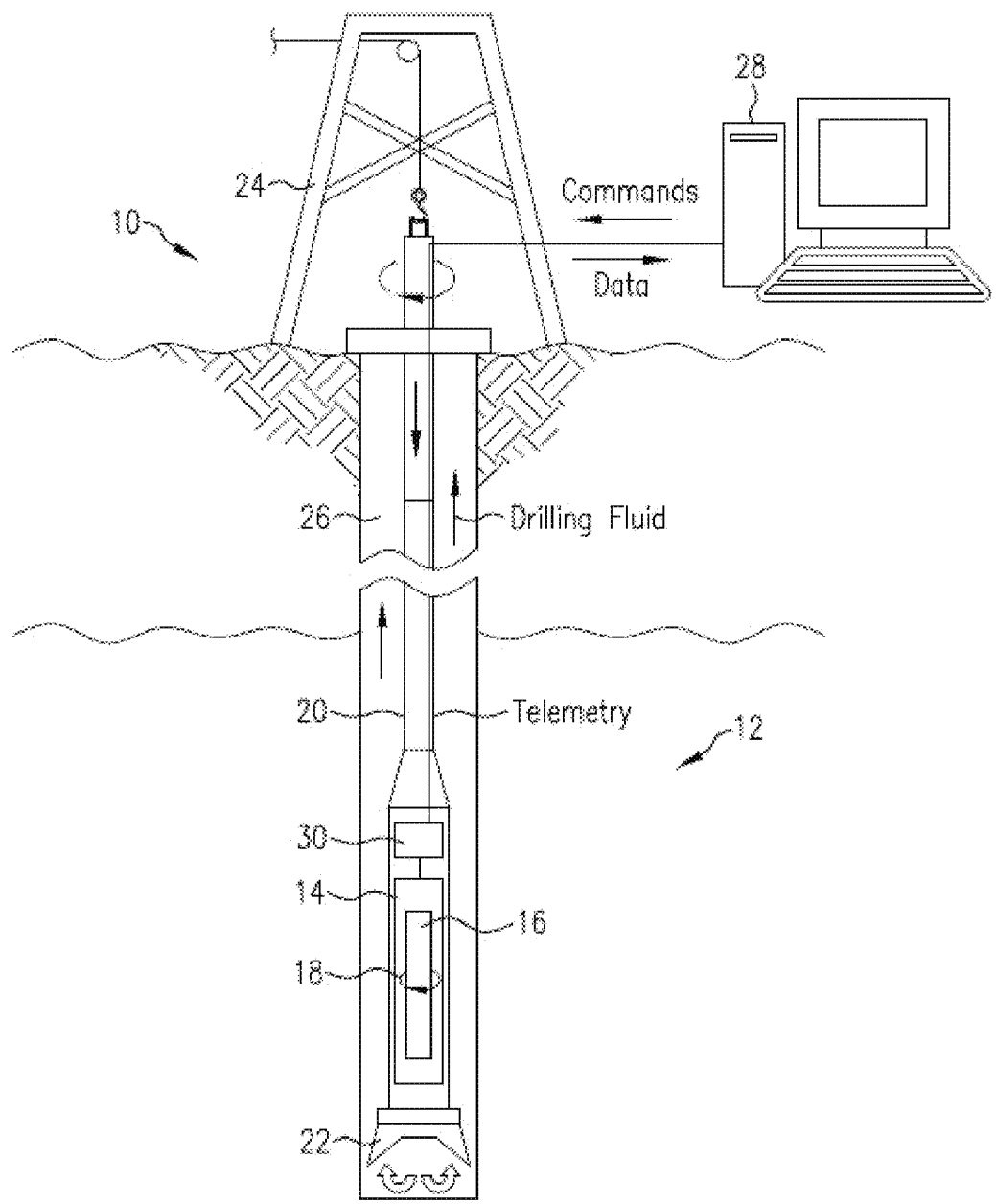
FIG. 1 depicts an embodiment of a formation measurement system that includes a nuclear magnetic resonance (NMR) measurement apparatus or tool.

FIG. 1 illustrates an exemplary embodiment of a downhole measurement, data acquisition, and/or analysis system 10 that includes devices or systems for in-situ measurement of characteristics of a subterranean region, such as an earth formation 12. The system 10 includes a magnetic resonance apparatus such as a NMR tool 14. An example of the magnetic resonance apparatus is a logging-while-drilling (LWD) magnetic resonance tool. The tool 14 is configured to generate magnetic resonance data for use in estimating characteristics of a formation, such as porosity, irreducible water saturation, permeability, hydrocarbon content, and fluid viscosity.

An exemplary tool 14 includes a static magnetic field source 16 that magnetizes formation materials and an antenna assembly 18. The antenna assembly 18 includes a transmitting antenna that transmits radio frequency (RF) energy or pulsed energy that provides an oscillating magnetic field in a volume of interest, e.g., the formation 12. The antenna assembly 18 also includes a receiving antenna for detection of NMR signals in the form of measurement of magnetic fields produced by nuclei in the volume of interest. It can be appreciated that the tool 14 may include a variety of components and configurations as known in the art of nuclear magnetic resonance or magnetic resonance imaging.

The tool 14 may be configured as a component of various subterranean systems, such as wireline well logging and LWD systems. For example, the tool 14 can be incorporated within a drill string 20 including a drill bit 22 or other suitable carrier and deployed downhole, e.g., from a drilling rig 24 into a borehole 26 during a drilling operation. The tool 14 is not limited to the embodiments described herein, and may be deployed in a carrier with alternative conveyance methods. A "carrier" as described herein means any device, device component, combination of devices, media and/or member that may be used to convey, house, support or otherwise facilitate the use of another device, device component, combination of devices, media, and/or member. Exemplary non-limiting carriers include drill strings of the coiled tube type, of the jointed pipe type, and any combination or portion thereof. Other carrier examples include casing pipes, wirelines, wireline sondes, slickline sondes, drop shots, downhole subs, bottom-hole assemblies, and drill strings.

In one embodiment, the tool 14 and/or other downhole components are equipped with transmission equipment to communicate ultimately to a surface processing unit 28. Such transmission equipment may take any desired form, and different transmission media and methods may be used, such as wired, fiber optic, and/or wireless transmission methods. Additional processing units may be deployed with the carrier. For example, a downhole electronics unit 30 includes various electronic components to facilitate receiving signals and collect data, controlling antennas, effecting impedance control, transmitting data and commands, and/or processing data downhole. The surface processing unit 28, electronics 30, the tool 14, and/or other components of the system 10 include devices as necessary to provide for storing and/or processing data collected from the tool 14 and other components of the system 10. Exemplary devices include, without limitation, at least one processor, storage, memory, input devices, output devices, and the like.

Magnetic resonance measurements are performed by generating a static magnetic field ($B_0$) by the magnetic field source 16 (e.g., a permanent magnet) in a volume (the sensitive volume) within the formation. An oscillating (e.g., RF) magnetic field ($B_1$), which is at least substantially orthogonal to the static magnetic field, is generated in the sensitive formation volume using a transmitting antenna. The B1 field as generated in the sensitive volume may be referred to as a measurement signal.

The receiving antenna detects a NMR signal excited by the static and oscillating magnetic fields, and captures relaxation back to thermal equilibrium. NMR signals originate from the net magnetization of nuclei in the sensitive volume. These signals generally include a series of spin echoes (i.e. resulting in an echo train), which are detected by the tool, numerically processed, and ultimately displayed in NMR logs. The amplitude of these spin echoes can be detected as a function of time, allowing for detection of both the initial amplitude (i.e. for porosity measurement) and the signal decay, which can be used to derive other formation and fluid characteristics after the data inversion procedure.

Figure 2:
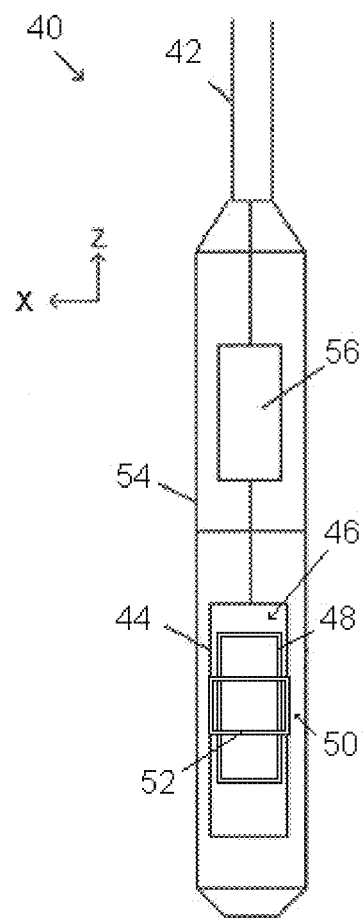
FIG. 2 depicts an embodiment of a downhole tool for performing NMR measurements, the tool including physically separated transmitter and receiver coils.

FIG. 2 depicts an example of a measurement apparatus configured as a NMR tool 40 for logging a formation. The tool 40 may be a wireline tool in which the tool 40 is connected to the surface via a wireline 42, a LWD tool or any other suitable type of tool. The static magnetic field source includes one or more magnet assemblies 44 (also referred to as magnets). The magnet assemblies 44 described in embodiments herein are permanent magnets, but are not so limited. In one embodiment, the magnet assemblies include electromagnets, a combination of permanent magnets and electromagnets, or magnets in combination with soft magnetic materials.

The tool 40 includes one or more transmitting antennas and one or more receiving antennas. The transmitter and receiver antennas may be configured as a transceiver capable of both transmission and reception, or as separate antennas. In one embodiment, the transmitter antenna includes at least one transmitter coil electrically connected to a circuit configured for active control of the transmitting antenna, and the receiving antenna includes at least one receiver coil electrically connected to a receiver control circuit. In one embodiment, the receiver coil (or coils) is physically separate from the transmitter coil (or coils) to reduce undesired coupling.

For example, referring to FIG. 2, the tool 40 includes a transmitting antenna 46 that includes one or more transmitter coils 48, and a receiving antenna 50 that includes one or more receiver coils 52. The transmitter and/or receiver antenna may have a single or multiple loops, windings, or turns.

Other components of the tool 40 include, for example, a sonde 54 or other carrier, and an electronics unit 56 connected to the antennas 46 and 50, and/or to the magnet assembly 44. The electronics unit 56 and/or coils are connected to a surface location via the wireline 42 or other suitable telemetry system.

As noted above, the tool 40 may include separate antennas/coils for transmitting and receiving. Using separate antennas is advantageous over single antenna configurations. For single antenna tools, due to dramatic amplitude differences between transmission pulses and generated NMR signals, efforts must be spent removing energy from the antenna to faithfully receive the NMR signal. Distinct coils for excitation and reception can help mitigate these issues.

In one embodiment, an NMR assembly, such as the NMR tool 14 or the NMR tool 40, includes or is connected to a control system that is configured to actively adjust or control properties of the transmitting antenna and the receiving antenna. The control system includes a number of switches that are controllable by a processing device (e.g., a controller) to adjust properties such as inductance, capacitance, resistive load and voltage level. Such adjustments are performed to control the impedance of the antennas in order to reduce or eliminate electromagnetic coupling between the transmitting antenna and the receiving antenna during NMR measurements.

Embodiments described herein are advantageous in that they can reduce or eliminate negative effects due to antenna coupling, to an extent that is greater than conventional systems, including conventional NMR tools that have separate transmitting and receiving antennas.

Tools used for nuclear magnetic resonance (NMR) typically use a transmitting antenna to send radio frequency (RF) pulses to terrestrial formations. In such a system, once the primary RF excitation/refocusing field has been removed, a receiving antenna captures the response of fluids within the formations. The voltage applied to the transmitter antenna is typically much higher than the voltage detected from the formation at the receiver antenna. For example, the ratio of the RF excitation pulse voltage applied to the transmitting antenna in relation to the secondary response voltage induced in the receiving antenna can be of the order of 240 dB or more. At the same time, the primary RF pulse and the formation's response occur at the same frequency. The combination of those two factors results in negative effects due to mutual coupling of the receiving antenna and the transmitting antenna, which can be detrimental to NMR systems, e.g., by reducing signal-to-noise ratios (SNR) and increasing echo times (TE).

Even though separating the receiving antenna from the transmitting antenna can alleviate the severity of the coupling and negative effects, undesirable electromagnetic coupling can still occur between the two antennas, which can be capacitive, magnetic, or both. Due to the undesirable coupling, the large induced voltage in the receiver antenna associated with the RF pulse can saturate or even damage the receiver's circuitry. Not only does the unwanted residue induced by the RF pulse add noise to the receiver signal, but the coupling of the receiving antenna to the transmitting also degrades the transmitter's Q factor, which requires more power in transmission. Embodiments described herein include components and methods, including a switching sequence, that reduces or eliminates the above problems, and improves performance of NMR tools, e.g., reduces the dead time of NMR echo acquisitions and improves the transmit efficiency.

The control system includes various features, components and functionality for active impedance control of the transmitting and receiving antennas. Impedance control is performed to reduce or eliminate mutual coupling between the antenna. The impedance control provides for impedance and coupling control in separate antennas, such as antennas disposed proximate to each other (e.g., in the FIGS. 1 and 2), in which coupling can occur.

Figure 3:
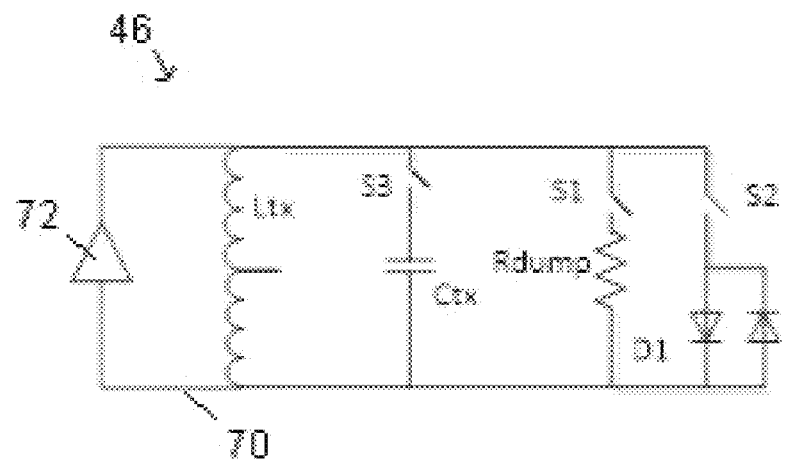
FIG. 3 depicts an embodiment of a transmitting antenna including a circuit having components for active impedance control, the transmitting antenna being part of an NMR measurement apparatus or tool.
Figure 4:
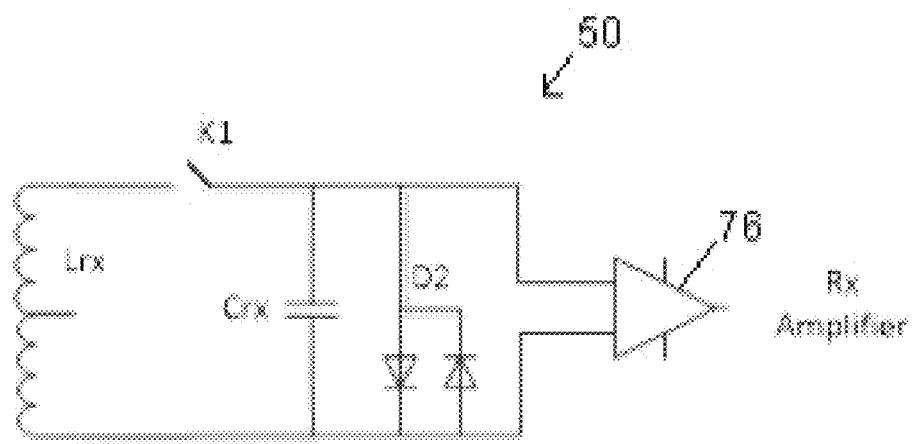
FIG. 4 depicts an embodiment of a receiving antenna that is part of the NMR measurement apparatus of FIG. 3, and that includes a circuit having components for active impedance control.

FIG. 3 depicts an embodiment of a transmitting antenna, such as the transmitting antenna 46, and FIG. 4 depicts an embodiment of a receiving antenna, such as the receiving antenna 50. In one embodiment, the antennas 46 and 50 are physically separated and are part of a NMR measurement assembly, such as the tool 40. Generally, the transmitting antenna 46 produces RF fields ($B_1$) that are predominantly orthogonal to a static magnetic field ($B_0$) in a sensitive volume. The receiving antenna 50 detects NMR signals induced in a formation or other subterranean region.

Referring to FIG. 3, the transmitter antenna 46 includes a transmitter coil 70 that includes a power amplifier 72 and an inductor "Ltx." A capacitor "Ctx" forms a tuned, parallel resonant inductance-capacitance (LC) tank circuit in which the inductor Ltx is magnetically coupled to a volume being excited (the sensitive volume). For a given transmission frequency, the tank circuit may be tuned, using the capacitor Ctx, to a high electrical quality factor (Q-factor) so that significant power consumption can be saved. For example, a "high" Q factor could be in the range of 50 to 150 for frequency ranges typically used in NMR logging.

The transmitter antenna 46, in one embodiment, also includes a dissipating component configured to be selectively connected to the transmitter coil for dissipation of stored energy. For example, a resistor "Rdump" is configured to be selectively connected to the transmitter coil 70 to increase the resistive load of the transmitter coil 70 for dissipating any stored energy after transmission. The transmitter antenna 46 may also include a component selectively connectable to the transmitter coil to restrict the transmitting antenna to a selected voltage level. For example, a clamp circuit "D1" including parallel opposing diodes is also selectively connected to the transmitter coil 70 to restrict the transmitting antenna 46 to a low voltage (e.g., voltage of NMR signals received from the sensitive volume) and produce a high impedance to low voltages. The clamp circuit D1 serves to reduce or minimize negative effects on the receiver antenna Q-factor.

The inductor Ltx, the resistor Rdump and the clamp circuit D1 are connected in parallel as shown in FIG. 3, although they may be configured in any suitable manner so that they can be selectively connected to the transmit coil 70. As discussed further below, the capacitor Ctx, the resistor Rdump and the clamp circuit D1 may be connected to the coil 70 by switches that are actively controlled.

In one embodiment, a "low voltage" level is a voltage value or range of voltages generated in the receiver antenna 50 during a receive mode when performing NMR measurements. A "high voltage" or "transmit voltage" level is a voltage value or range generated in the transmitter antenna 46 during a transmit mode.

Referring to FIG. 4, the receiver antenna 50 includes a receiver coil 74, which includes an inductor "Lrx" in series with a capacitor "Crx." The receiving antenna 50 also includes an amplifier 76 connected to an acquisition unit, for boosting received signals. The receiver antenna 50 may also be tuned to a high Q-factor so that the induced voltage signal can be amplified at an early stage in the receive chain to improve the signal-to-noise ratio (SNR). A high Q resonant tank in the receiver antenna 50 acts as a narrowband filter that can boost signals at the resonant frequency and suppress noise outside the antenna's passband.

The transmitter antenna 46 and the receiver antenna 50 are connected to a controller configured to provide active impedance control of both the transmitting and receiving antennas. As discussed further below, the controller is electrically connected to the transmitter antenna 46 and the receiver antenna 50 and controls the impedance of the transmit antenna and/or the receiver antenna. The controller is configured to control properties of the antennas, including the resistive load, the capacitance, and/or the coupling inductance of the antennas.

The controller realizes active impedance control by actively controlling properties of the transmitting and receiving antennas. In one embodiment, the controller is operably connected to a number of switches. The switches are operable by the controller to control NMR signal generation and acquisition, and to control or adjust properties of the antennas. The controller may be downhole or connected to the surface. The controller may be operated by a processor, a human operator or both.

Referring to FIG. 3, in one embodiment, the transmitter antenna 46 includes a first switch "S1" (also referred to as a "dump switch") between the resistor Rdump and the inductor Ltx so that the resistor Rdump can be electrically connected and disconnected therefrom. The clamp circuit D1 is connected to the transmitter coil 70 by a second switch S2, referred to as a "clamp switch." A third switch S3, referred to as a "tuner switch," allows the capacitor Ctx to be connected to the inductor Ltx to control the transmission frequency.

Referring to FIG. 4, in one embodiment, the receiving antenna 50 includes a switch "K1," also referred to as a "receiver switch," which allows the receiving antenna 50 to be de-energized as desired. For example, the receiver antenna 50 can be de-energized while the transmitting antenna 46 is transmitting, to reduce effects of coupling between the transmitting antenna 46 and the receiving antenna 50.

In one embodiment, the controller is configured to operate the antennas during measurement according to a switching sequence that is based on the antennas' operational modes. The switching sequence provides for adjustment of antenna properties during measurements to reduce or eliminate coupling. The switches can be driven by, e.g., isolated, high-side, or other drivers.

FIGS. 5-8 depict aspects of a switching sequence that may be employed by the controller and/or other processor during a NMR measurement process. In the following, various switches are controlled based on different operating modes of a NMR assembly or measurement tool. FIGS. 5-8, which are provided to be illustrative and non-limiting, show the positions (open and closed) of the switches S1, S2, S3 and K1 during each mode of a NMR measurement.

The transmitting antenna 46 and the receiving antenna 50 operate in various modes or operational states. One mode is a transmit mode, during which measurement signals are transmitted into a sensitive volume by exciting the transmitter coil 70 according to a selected measurement frequency. During the transmit mode, the receiving antenna 50 is set to a high impedance as compared to the transmitting antenna 46. The antennas also operate in a number of intermediate modes, during which properties of the antennas are adjusted to reduce coupling effects. During one or more receive modes, the transmitting antenna 46 is de-energized and set to a high impedance as compared to the receiving antenna 50 to reduce coupling therebetween.

One antenna is set with high impedance in order to reduce its negative influences (e.g., reduced Q factor, increased noise, and overvoltage spikes) on the other antenna. Reducing the current flow in one antenna will reduce or minimize its coupling to the other antenna.

In the following example, a NMR measurement device or tool is controlled during a NMR measurement process using a switching sequence. The switching sequence includes a number of stages. In one embodiment, the stages are performed in the order described. However, some stages may be omitted or performed in a different order.

Figure 5:
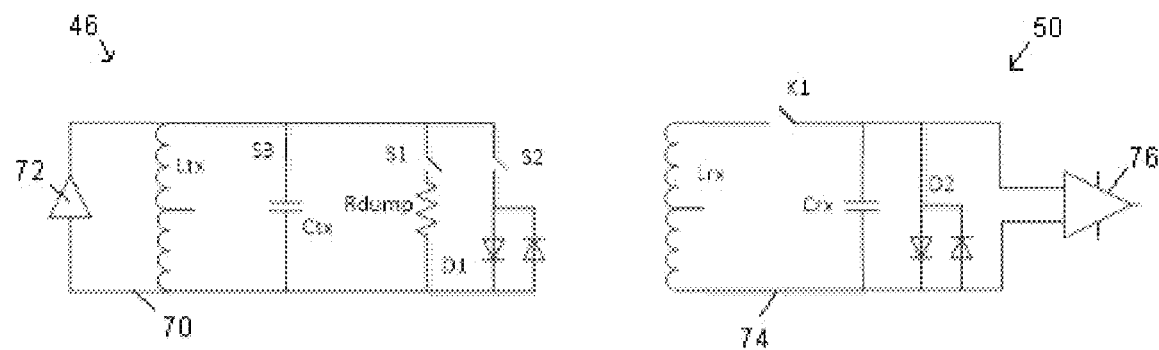
FIG. 5 depicts an operating state of the receiving antenna and the transmitting antenna of FIGS. 3 and 4, when the NMR assembly is in a transmit mode.

In a first stage, the NMR tool is placed is in a transmit mode, during which the transmitting antenna transmits measurement signals. During the transmit mode, the switches are set as shown in FIG. 5. Specifically, the switch K1 is turned off (opened) so that the receiver antenna 50 is de-energized and disconnected from the receiver tuning capacitor Crx. The switches S1 and S2 are turned off so that the resistor Rdump and the clamp circuit are disconnected from the transmitter coil 70.

The switch S3 is turned on (closed), and the power amplifier 72 drives RF pulses to the transmitter coil 70. The capacitor Ctx is used to tune the antenna tank response to a predefined resonance frequency. During this stage, the receiving antenna 50 is disconnected from its tuning capacitor Crx. The opened receiving antenna reduces or minimizes the degradation of the transmitting antenna's Q factor when coupling is not negligible. As a result, the transmitting antenna 46 has an increased or maximum Q-factor to reduce the power consumption in transmission.

Figure 6:
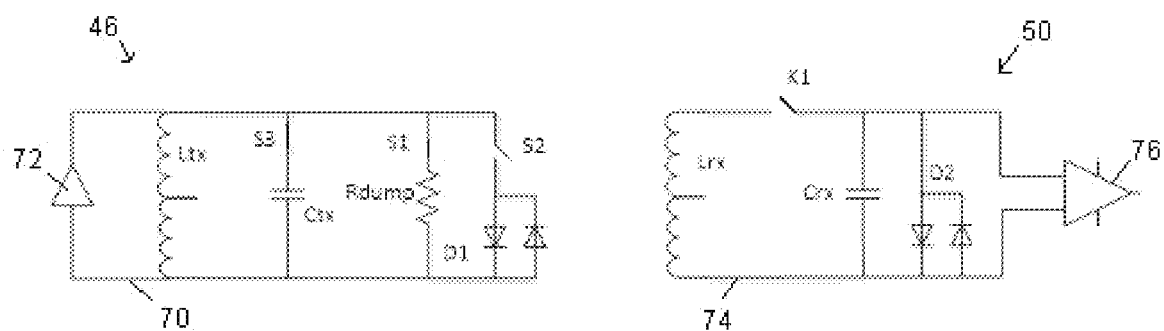
FIG. 6 depicts an operating state of the receiving antenna and the transmitting antenna of FIGS. 3-5, when the NMR assembly is in a dump mode.

Referring to FIG. 6, in a second stage, after generation of the transmission signal is complete, the tool moves to a dump mode in order to "dump" or remove any stored energy from the transmitting antenna 46. In the dump mode, the receiver switch K1 remains open, and the RF power driver 72 is stopped. Switch S1 is turned on to connect the power resistor Rdump to dissipate stored energy once RF transmission completes. The switch S3 remains closed or turned on, and the switch S2 remains open or turned off.

Figure 7:
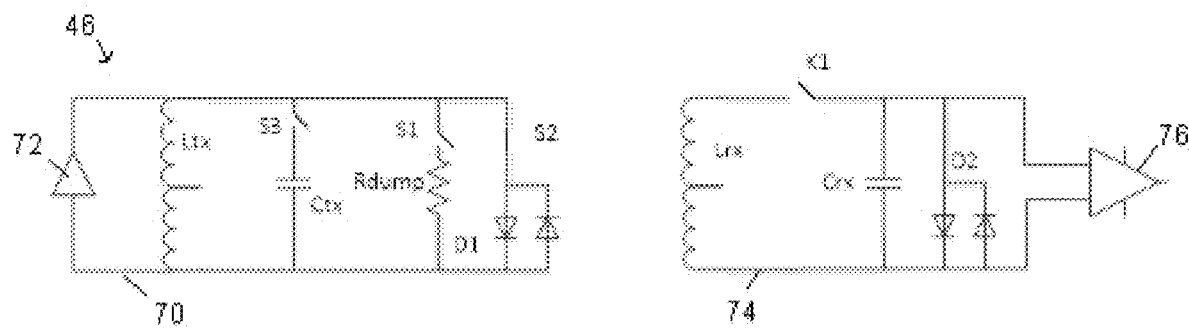
FIG. 7 depicts an operating state of the receiving antenna and the transmitting antenna of FIGS. 3-6, when the NMR assembly is in a voltage clamp mode.
Figure 8:
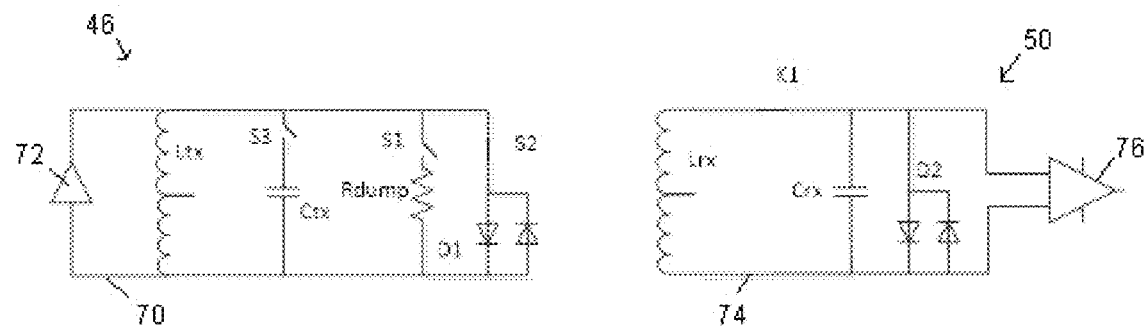
FIG. 8 depicts an operating state of the receiving antenna and the transmitting antenna of FIGS. 3-7, when the NMR assembly is in one or more receive modes.

In a third stage, the controller causes the antennas to enter a clamp mode, during which the transmitting antenna 46 is restricted or clamped to a selected voltage level. As shown in FIG. 7, after the energy of the transmitting antenna 46 is discharged, the dump resistor Rdump is disconnected from the antenna by turning off the switch S1. Next, the switch S2 is turned on to clamp the transmitting antenna 46 to a low voltage via the protection clamp diode D1. Switch S3 is turned off, which disconnects the tuning capacitor Ctx. The switch K1 remains open.

As a result, the transmitting antenna 46 will experience large impedance for low voltage signals and low impedance for high voltage signals due to the diode clamp D1. Since the transmitting antenna 46 s de-energized and the induced signal from the sensitive volume is low voltage (e.g., under one millivolt), the transmitting antenna 46 acts similarly to an open circuit for the receiving antenna 50, which minimizes the degradation of the receiving antenna's Q factor.

In a fourth stage, the tool enters one or more receive modes, in which the switch K1 is turned on (closed) and the receiver coil 50 detects NMR signals generated in the subterranean region. In one embodiment, the tool enters two subsidiary modes, referred to as a hold mode and an acquisition mode. During the hold mode, the receiving antenna 50 is prepared for detecting NMR signals, and during the acquisition mode, NMR signals are detected and processed.

During the hold mode, the receiver switch K1 is turned on, and the capacitor Crx tunes the receiver antenna tank circuit to the same frequency as the transmitting antenna 46. The receiving antenna 50 therefore operates in the high Q configuration. In one embodiment, the capacitor Crx may be assigned a large value to initially detune the receiving antenna 50, which reduces the transient voltage at the amplifier 76. Ultimately, the capacitor Crx is tuned to boost the NMR signals from the sensitive volume In one embodiment, the receiving antenna includes a clamp circuit D2 that is used to protect overvoltage signals due to coupling between the receiving antenna 50 and the sensitive volume or the transmitting antenna 46. An additional resistor may be included in the receiving antenna 50, in parallel to the tuning capacitor Crx, to accelerate the disposal of the receiving antenna's energy, if any during the hold mode. The additional resistor may then be disconnected from the receiver coil 74.

During the acquisition mode, NMR signals are received by the receiver coil 74, and the signals are boosted by the resonance circuit composed of the receiver coil 74 and the capacitor Crx. The NMR signals are then amplified, filtered, digitalized, and processed. The processed signals may then be used for various purposes, such as estimating properties of the sensitive volume. For example, if the sensitive volume is a formation, the properties may include porosity and permeability.

After signal acquisition, the sequence returns to the first stage and repeats as desired. Before the receiving antenna is enabled to sense the NMR signal, the amplifier 76 may be set to a power-down mode to avoid saturation caused by unwanted signals.

It is noted that the switches may be of any suitable type. Examples of switches include MOSFETs, transistors, relays, and PIN diodes.

For example, the switch K1 may one of various types of switches, including field effect transistors (FETs). The drain to source voltage (Vds) of the switch K1 at the off state (open) can be estimated as:

$$Vds = (\text{Inductance } Rx)/(\text{Inductance } Tx) * \text{Coupling Coefficient} * RF \text{ Voltage};$$

where "Inductance Rx" is the inductance of the receiving antenna 50 and "Inductance Tx" is the inductance of the transmitting antenna 46.

In this example, the Coupling Coefficient is 0.1 and the RF Voltage (applied to the transmitting antenna) is 1200 Volts. Vds is calculated as follows:

$$Vds = 1nH/2nH * 0.1 * 1200V = 60V.$$

Due to this low Vds requirement, various switches can be designed, such as switches that have an Rds (drain-source on resistance) less than about 30 m$\Omega$ and a Cds (drain-source capacitance) less than about 500 pC. Using such switches, the transient current at the receiving antenna is less than 1 A when switching K1 on. In contrast to a 100 A peak current in the transmitting antenna 46 at 1200V, the peak current in the receiving antenna 50 (as induced by the capacitance "Cds" of K1) is 1 A at 60V, which has a negligible effect on the transmitting antenna's performance.

When the receiving antenna 46 is disconnected from the capacitor Crx (the switch K1 is turned off), the voltage (Vrx) as seen by the receiver amplifier 76 can be estimated by Cds/(Cds+Crx)*60V. As a result, a simple way to minimize the Vrx is to keep a large Crx before tuning the receiver antenna 50.

The measurement apparatuses and antenna configurations described herein may be used in various methods for estimating formation characteristics. An example of a method includes taking downhole NMR measurements as part of well logging and/or LWD operation. NMR measurements can be performed to estimate various properties of a formation, such as porosity, permeability and fluid content.

An example of a method is described as follows. In this example, the method is performed in conjunction with the system 10 of FIG. 1, but is not so limited. The method may be used with any device or system that performs NMR measurements and/or receives NMR measurement data.

The method may be performed in conjunction with the system 10 and/or embodiments of the NMR apparatus, but is not limited thereto. The method includes one or more stages described below. In one embodiment, the method includes the execution of all of the stages in the order described. However, certain stages may be omitted, stages may be added, or the order of the stages changed.

In a first stage, an NMR or other magnetic resonance measurement tool is deployed into a borehole. In one embodiment, the tool (e.g., the tool 14 and/or the tool 40) is deployed as part of an open hole wireline operation, or during drilling as part of a LWD operation. The tool includes a permanent magnet, and physically separated transmitting and receiving antennas as described above.

In the second stage, NMR data is acquired by performing an NMR measurement. The NMR measurement includes applying a static magnetic field $B_0$ to the surrounding formation volume, and transmitting a radiofrequency (RF) or other pulsed signal into a subterranean region (e.g., a hydrocarbon or other energy bearing formation) that generates an oscillating magnetic field $B_1$. The receiving antenna detects NMR signals from the volume in response to the interaction between the nuclear spins of interest and the static and oscillating magnetic fields, and generates NMR data by measuring spin echo trains from the formation.

During generation and transmission of the measurement signal, as well as detection of signals from the volume, properties of the transmitting antenna and the receiving antenna are controlled or adjusted to reduce or minimize mutual coupling. For example, the transmitting antenna and the receiving antenna are operated according to the switching sequence as discussed above.

In the third stage, the NMR data is analyzed to estimate characteristics of the formation. For example, spin echo data is converted to a distribution of $T_2$ relaxation times. $T_2$ distributions can then be used to estimate permeability and fluid properties, or to perform fluid typing or more advanced petrophysical analyses.

The NMR data may be utilized in various ways. For example, permeability and porosity estimations can be used to inform the control of various operational parameters (e.g., rate of penetration, weight on bit, borehole direction, etc.) during a drilling operation. In addition, NMR data can be used to evaluate operations and/or plan subsequent operations, such as drilling, production and stimulation operations. For example, NMR data can be used to estimate fracture properties in a formation, which can be used to plan, control and/or evaluate hydraulic fracturing operations.

Set forth below are some embodiments of the foregoing disclosure:

Embodiment 1: A nuclear magnetic resonance (NMR) measurement apparatus comprising: a magnet configured to generate a static magnetic field in a sensitive volume; a transmitting antenna including a transmitter coil, a capacitor, a dissipating component and a restricting component, the capacitor configured to tune the transmitting antenna to a selected transmission frequency; a receiving antenna physically separated from the transmitting antenna; a processor electrically connected to the transmitting antenna and the receiving antenna, the processor configured to perform: applying a drive signal at a first voltage level to the transmitter coil to generate a transmission signal in the sensitive volume having a frequency corresponding to the selected transmission frequency, wherein the receiving antenna is deactivated during generation of the transmission signal; connecting the dissipating component to the transmitter coil to dissipate stored energy in the transmitter coil; connecting the restricting component to the transmitter coil to restrict the transmitting antenna to a second voltage level and increase an impedance of the transmitting antenna to the second voltage level, the second voltage level smaller that the first voltage level and based on a voltage of NMR signals from the sensitive volume; and activating the receiving antenna and detecting a NMR signal, wherein the restricting component is connected to the transmitter coil and restricts the transmitting antenna during the activating and the detecting.

Embodiment 2: The apparatus of any prior embodiment, wherein the apparatus is configured to be deployed in a borehole in a subterranean region, and the processor is configured estimate a property of the subterranean region based on the detected NMR signal.

Embodiment 3: The apparatus of any prior embodiment, wherein the transmitting antenna defines a transmission circuit including an inductor, the capacitor, the dissipating component and the restricting component, the transmission circuit including a first switch between the dissipating component and the inductor, a second switch between the restricting component and the inductor, and a third switch between the capacitor and the inductor.

Embodiment 4: The apparatus of any prior embodiment, wherein the receiving antenna includes an inductor in series with a capacitor, and includes a receive switch between the inductor and the capacitor.

Embodiment 5: The apparatus of any prior embodiment, wherein the processor is configured to operate in a transmit mode during which the transmission signal is generated, an intermediate mode during which the impedance of the transmission coil is increased, and a receive mode during which the receiving antenna is actuated and NMR signals are detected.

Embodiment 6: The apparatus of any prior embodiment, wherein during the transmit mode, the third switch is closed, and the first switch, the second switch and the receive switch are open.

Embodiment 7: The apparatus of any prior embodiment, wherein the processor is configured to perform a switching sequence that includes: during the intermediate mode, closing the first switch to dissipate the stored energy; and subsequently opening the first switch and the third switch, and closing the second switch to connect the restricting component to the transmission coil.

Embodiment 8: The apparatus of any prior embodiment, wherein the switching sequence includes: during the receive mode, closing the receive switch and tuning the receiving antenna to the selected frequency.

Embodiment 9: The apparatus of any prior embodiment, wherein the restricting component includes a clamp circuit having a first diode in parallel with a second diode, the first diode and the second diode having opposite directions.

Embodiment 10: The apparatus of any prior embodiment, wherein the transmitting antenna is configured to generate an oscillating magnetic field in the sensitive volume, the oscillating magnetic field being at least substantially orthogonal to the static magnetic field in the sensitive volume, and the receiver antenna has an orientation that is at least substantially orthogonal to the static magnetic field in the sensitive volume.

Embodiment 11: A method of performing a nuclear magnetic resonance (NMR) measurement comprising: disposing a measurement tool proximate to a sensitive volume, the measurement tool including a magnet configured to generate a static magnetic field in the sensitive volume, a transmitting antenna, and a receiving antenna physically separated from the transmitting antenna, the transmitting antenna including a transmitter coil, a capacitor, a dissipating component and a restricting component, the capacitor configured to tune the transmitting antenna to a selected transmission frequency; generating a static magnetic field by the magnet; applying a drive signal at a first voltage level to the transmitter coil to generate a transmission signal in the sensitive volume having a frequency corresponding to the selected transmission frequency, wherein the receiving antenna is deactivated during generation of the transmission signal; connecting the dissipating component to the transmitter coil to dissipate stored energy in the transmitter coil; connecting the restricting component to the transmitter coil to restrict the transmitting antenna to a second voltage level and increase an impedance of the transmitting antenna to the second voltage level, the second voltage level smaller that the first voltage level and based on a voltage of NMR signals from the sensitive volume; and activating the receiving antenna and detecting a NMR signal, wherein the restricting component is connected to the transmitter coil and restricts the transmitting antenna during the activating and the detecting.

Embodiment 12: The method of any prior embodiment, wherein disposing the measurement tool includes deploying the measurement tool in a subterranean region, the method further comprising estimating a property of the subterranean region based on the detected NMR signal.

Embodiment 13: The method of any prior embodiment, wherein the transmitting antenna defines a transmission circuit including an inductor, the capacitor, the dissipating component and the restricting component, the transmission circuit including a first switch between the dissipating component and the inductor, a second switch between the restricting component and the inductor, and a third switch between the capacitor and the inductor.

Embodiment 14: The method of any prior embodiment, wherein the receiving antenna includes an inductor in series with a capacitor, and includes a receive switch between the inductor and the capacitor.

Embodiment 15: The method of any prior embodiment, wherein the measurement tool is configured to operate in a transmit mode during which the transmission signal is generated, an intermediate mode during which the impedance of the transmission coil is increased, and a receive mode during which the receiving antenna is actuated and NMR signals are detected.

Embodiment 16: The method of any prior embodiment, wherein during the transmit mode, the third switch is closed, and the first switch, the second switch and the receive switch are open.

Embodiment 17: The method of any prior embodiment, further comprising performing a switching sequence that includes: during the intermediate mode, closing the first switch to dissipate the stored energy; and subsequently opening the first switch and the third switch, and closing the second switch to connect the restricting component to the transmission coil.

Embodiment 18: The method of any prior embodiment, wherein the switching sequence includes: during the receive mode, closing the receive switch and tuning the receiving antenna to the selected frequency.

Embodiment 19: The method of any prior embodiment, wherein the restricting component includes a clamp circuit having a first diode in parallel with a second diode, the first diode and the second diode having opposite directions.

Embodiment 20: The method of any prior embodiment, wherein the transmitting antenna is configured to generate an oscillating magnetic field in the sensitive volume, the oscillating magnetic field being at least substantially orthogonal to the static magnetic field in the sensitive volume, and the receiver antenna has an orientation that is at least substantially orthogonal to the static magnetic field in the sensitive volume.

In connection with the teachings herein, various analyses and/or analytical components may be used, including digital and/or analog subsystems. The system may have components such as a processor, storage media, memory, input, output, communications link (wired, wireless, pulsed mud, optical or other), user interfaces, software programs, signal processors and other such components (such as resistors, capacitors, inductors, etc.) to provide for operation and analyses of the apparatus and methods disclosed herein in any of several manners well-appreciated in the art. It is considered that these teachings may be, but need not be, implemented in conjunction with a set of computer executable instructions stored on a computer readable medium, including memory (ROMs, RAMs), optical (CD-ROMs), or magnetic (disks, hard drives), or any other type that when executed causes a computer to implement the method of the present invention. These instructions may provide for equipment operation, control, data collection and analysis and other functions deemed relevant by a system designer, owner, user, or other such personnel, in addition to the functions described in this disclosure.

One skilled in the art will recognize that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

While the invention has been described with reference to exemplary embodiments, it will be understood by those skilled in the art that various changes may be made and equivalents may be substituted for elements thereof without departing from the scope of the invention. In addition, many modifications will be appreciated by those skilled in the art to adapt a particular instrument, situation or material to the teachings of the invention without departing from the essential scope thereof. Therefore, it is intended that the invention not be limited to the particular embodiment disclosed as the best mode contemplated for carrying out this invention.

What is claimed is:

1. A nuclear magnetic resonance (NMR) measurement apparatus comprising:
    a magnet configured to generate a static magnetic field in a sensitive volume;
    a transmitting antenna including a transmitter coil, a capacitor, a dissipating component and a restricting component, the capacitor configured to tune the transmitting antenna to a selected transmission frequency;
    a receiving antenna physically separated from the transmitting antenna;
    a processor electrically connected to the transmitting antenna and the receiving antenna, the processor configured to perform:
    applying a drive signal at a first voltage level to the transmitter coil to generate a transmission signal in the sensitive volume having a frequency corresponding to the selected transmission frequency, wherein the receiving antenna is deactivated during generation of the transmission signal;
    connecting the dissipating component to the transmitter coil to dissipate stored energy in the transmitter coil;
    connecting the restricting component to the transmitter coil to restrict the transmitting antenna to a second voltage level and increase an impedance of the transmitting antenna to the second voltage level, the second voltage level smaller than the first voltage level and based on a voltage of NMR signals from the sensitive volume; and
    activating the receiving antenna and detecting a NMR signal, wherein the restricting component is connected to the transmitter coil and restricts the transmitting antenna during the activating and the detecting.

2. The apparatus of claim 1, wherein the apparatus is configured to be deployed in a borehole in a subterranean region, and the processor is configured to estimate a property of the subterranean region based on the detected NMR signal.

3. The apparatus of claim 1, wherein the transmitting antenna defines a transmission circuit including an inductor, the capacitor, the dissipating component and the restricting component, the transmission circuit including a first switch between the dissipating component and the inductor, a second switch between the restricting component and the inductor, and a third switch between the capacitor and the inductor.

4. The apparatus of claim 3, wherein the receiving antenna includes an inductor in series with a capacitor, and includes a receive switch between the inductor and the capacitor.

5. The apparatus of claim 4, wherein the processor is configured to operate in a transmit mode during which the transmission signal is generated, an intermediate mode during which the impedance of the transmission coil is increased, and a receive mode during which the receiving antenna is actuated and NMR signals are detected.

6. The apparatus of claim 5, wherein during the transmit mode, the third switch is closed, and the first switch, the second switch and the receive switch are open.

7. The apparatus of claim 6, wherein the processor is configured to perform a switching sequence that includes:
    during the intermediate mode, closing the first switch to dissipate the stored energy; and
    subsequently opening the first switch and the third switch, and closing the second switch to connect the restricting component to the transmission coil.

8. The apparatus of claim 7, wherein the switching sequence includes:

during the receive mode, closing the receive switch and tuning the receiving antenna to the selected frequency.

9. The apparatus of claim 1, wherein the restricting component includes a clamp circuit having a first diode in parallel with a second diode, the first diode and the second diode having opposite directions.

10. The apparatus of claim 1, wherein the transmitting antenna is configured to generate an oscillating magnetic field in the sensitive volume, the oscillating magnetic field being at least substantially orthogonal to the static magnetic field in the sensitive volume, and the receiver antenna has an orientation that is at least substantially orthogonal to the static magnetic field in the sensitive volume.

11. A method of performing a nuclear magnetic resonance (NMR) measurement comprising:
disposing a measurement tool proximate to a sensitive volume, the measurement tool including a magnet configured to generate a static magnetic field in the sensitive volume, a transmitting antenna, and a receiving antenna physically separated from the transmitting antenna, the transmitting antenna including a transmitter coil, a capacitor, a dissipating component and a restricting component, the capacitor configured to tune the transmitting antenna to a selected transmission frequency;
generating a static magnetic field by the magnet;
applying a drive signal at a first voltage level to the transmitter coil to generate a transmission signal in the sensitive volume having a frequency corresponding to the selected transmission frequency, wherein the receiving antenna is deactivated during generation of the transmission signal;
connecting the dissipating component to the transmitter coil to dissipate stored energy in the transmitter coil;
connecting the restricting component to the transmitter coil to restrict the transmitting antenna to a second voltage level and increase an impedance of the transmitting antenna to the second voltage level, the second voltage level smaller than the first voltage level and based on a voltage of NMR signals from the sensitive volume; and
activating the receiving antenna and detecting a NMR signal, wherein the restricting component is connected to the transmitter coil and restricts the transmitting antenna during the activating and the detecting.

12. The method of claim 11, wherein disposing the measurement tool includes deploying the measurement tool in a subterranean region, the method further comprising estimating a property of the subterranean region based on the detected NMR signal.

13. The method of claim 11, wherein the transmitting antenna defines a transmission circuit including an inductor, the capacitor, the dissipating component and the restricting component, the transmission circuit including a first switch between the dissipating component and the inductor, a second switch between the restricting component and the inductor, and a third switch between the capacitor and the inductor.

14. The method of claim 13, wherein the receiving antenna includes an inductor in series with a capacitor, and includes a receive switch between the inductor and the capacitor.

15. The method of claim 14, wherein the measurement tool is configured to operate in a transmit mode during which the transmission signal is generated, an intermediate mode during which the impedance of the transmission coil is increased, and a receive mode during which the receiving antenna is actuated and NMR signals are detected.

16. The method of claim 15, wherein during the transmit mode, the third switch is closed, and the first switch, the second switch and the receive switch are open.

17. The method of claim 16, further comprising performing a switching sequence that includes:
during the intermediate mode, closing the first switch to dissipate the stored energy; and
subsequently opening the first switch and the third switch, and closing the second switch to connect the restricting component to the transmission coil.

18. The method of claim 17, wherein the switching sequence includes:
during the receive mode, closing the receive switch and tuning the receiving antenna to the selected frequency.

19. The method of claim 11, wherein the restricting component includes a clamp circuit having a first diode in parallel with a second diode, the first diode and the second diode having opposite directions.

20. The method of claim 11, wherein the transmitting antenna is configured to generate an oscillating magnetic field in the sensitive volume, the oscillating magnetic field being at least substantially orthogonal to the static magnetic field in the sensitive volume, and the receiver antenna has an orientation that is at least substantially orthogonal to the static magnetic field in the sensitive volume.

* * * * *